(12) United States Patent
Tsurumaru

(10) Patent No.: US 9,835,658 B2
(45) Date of Patent: Dec. 5, 2017

(54) SEMICONDUCTOR INTEGRATED CIRCUIT DEVICE AND ELECTRONIC DEVICE FOR DRIVING A POWER SEMICONDUCTOR DEVICE

(71) Applicant: Renesas Electronics Corporation, Tokyo (JP)

(72) Inventor: Makoto Tsurumaru, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/216,859

(22) Filed: Jul. 22, 2016

(65) Prior Publication Data

US 2017/0063367 A1 Mar. 2, 2017

(30) Foreign Application Priority Data

Sep. 2, 2015 (JP) .................................. 2015-172625

(51) Int. Cl.
| | |
|---|---|
| *H03K 3/00* | (2006.01) |
| *G01R 19/165* | (2006.01) |
| *H02P 27/08* | (2006.01) |
| *H03K 17/082* | (2006.01) |
| *B60L 3/00* | (2006.01) |
| *B60L 3/12* | (2006.01) |

(Continued)

(52) U.S. Cl.
CPC .......... *G01R 19/165* (2013.01); *B60L 3/0061* (2013.01); *B60L 3/12* (2013.01); *B60L 7/14* (2013.01); *B60L 11/1803* (2013.01); *B60L 15/08* (2013.01); *H02P 27/08* (2013.01);

*H03K 17/0828* (2013.01); *B60L 2210/40* (2013.01); *B60L 2240/427* (2013.01); *B60L 2240/429* (2013.01); *H03K 17/042* (2013.01); *Y02T 10/645* (2013.01); *Y02T 10/7005* (2013.01); *Y02T 10/7241* (2013.01)

(58) Field of Classification Search
CPC .. H03K 17/567; H03K 17/0828; H02P 27/08; B60L 7/12; B60L 11/1805; G01R 19/165
See application file for complete search history.

(56) References Cited

U.S. PATENT DOCUMENTS

| | | | | |
|---|---|---|---|---|
| 5,144,514 | A | * 9/1992 | Sekigawa | ............ H03K 17/567 |
| | | | | 323/281 |
| 6,717,785 | B2 | * 4/2004 | Fukuda | ................ H03K 17/168 |
| | | | | 361/86 |

(Continued)

FOREIGN PATENT DOCUMENTS

JP 2011-097812 A 5/2011

*Primary Examiner* — Kenneth B Wells
(74) *Attorney, Agent, or Firm* — Sughrue Mion, PLLC

(57) ABSTRACT

Adjustment of drive control based on a detection voltage of a transformer requires a loop time, and therefore high-speed processing of the adjustment is difficult. A semiconductor integrated circuit device includes a driving circuit that drives a power semiconductor device and a driving capability control circuit that controls a driving capability of the driving circuit. The driving circuit stops driving of the power semiconductor device based on an abnormal current detected from a sense current of the power semiconductor device. The driving capability control circuit controls the driving capability of the driving circuit based on a normal current detected from the sense current of the power semiconductor device.

20 Claims, 14 Drawing Sheets

(51) Int. Cl.
*B60L 7/14* (2006.01)
*B60L 11/18* (2006.01)
*B60L 15/08* (2006.01)
*H03K 17/042* (2006.01)

(56) References Cited

U.S. PATENT DOCUMENTS

| | | | | |
|---|---|---|---|---|
| 7,535,283 B2 * | 5/2009 | Kojima | ............. | H03K 17/0828 327/108 |
| 8,582,335 B2 | 11/2013 | Hasegawa et al. | | |
| 2015/0236686 A1 * | 8/2015 | Senda | ................ | H03K 17/0828 327/381 |
| 2015/0318850 A1 * | 11/2015 | Hiyama | ............... | H03K 17/163 318/400.26 |

* cited by examiner

SEMICONDUCTOR INTEGRATED CIRCUIT DEVICE AND ELECTRONIC DEVICE FOR DRIVING A POWER SEMICONDUCTOR DEVICE

CROSS-REFERENCE TO RELATED APPLICATIONS

The disclosure of Japanese Patent Application No. 2015-172625 filed on Sep. 2, 2015 including the specification, drawings and abstract is incorporated herein by reference in its entirety.

BACKGROUND

The present disclosure relates to a semiconductor integrated circuit device, and is applicable to a semiconductor integrated circuit device that drives a power semiconductor device, such as an insulated gate bipolar transistor (IGBT).

An electric motor (a motor) is used as a power source of a hybrid electric vehicle (HEV), in which the electric motor is combined with an internal-combustion engine (a gasoline engine), or an electric vehicle (EV), for example. When the electric motor is driven, a power conversion device (an inverter) that performs DC to AC conversion is used for obtaining a predetermined torque and a predetermined power-supply frequency. In the inverter, a driving signal is controlled while a driving current of the motor is monitored by a current detector (see Japanese Unexamined Patent Application Publication No. 2011-97812, for example).

In a case of detecting a normal current from the motor driving current of each phase by means of the current detector such as a transformer, and an A/D converter of a control circuit, for example, and using the normal current for motor-driving control, it is difficult to achieve high-speed processing because current detection requires a loop time in which an output voltage of the transformer is subjected to A/D conversion in the control circuit and the driving control is adjusted based on that result.

Other problems and novel features will become apparent from the description of this specification and the accompanying drawings.

SUMMARY

The summary of a typical one of the present disclosures is briefly described below.

A semiconductor integrated circuit device includes a driving capability control circuit that controls a driving capability of a driving circuit based on a normal current detected from a sense current of a power semiconductor device.

According to the above semiconductor integrated circuit device, high-speed processing can be achieved.

DETAILED DESCRIPTION

Figure 1:
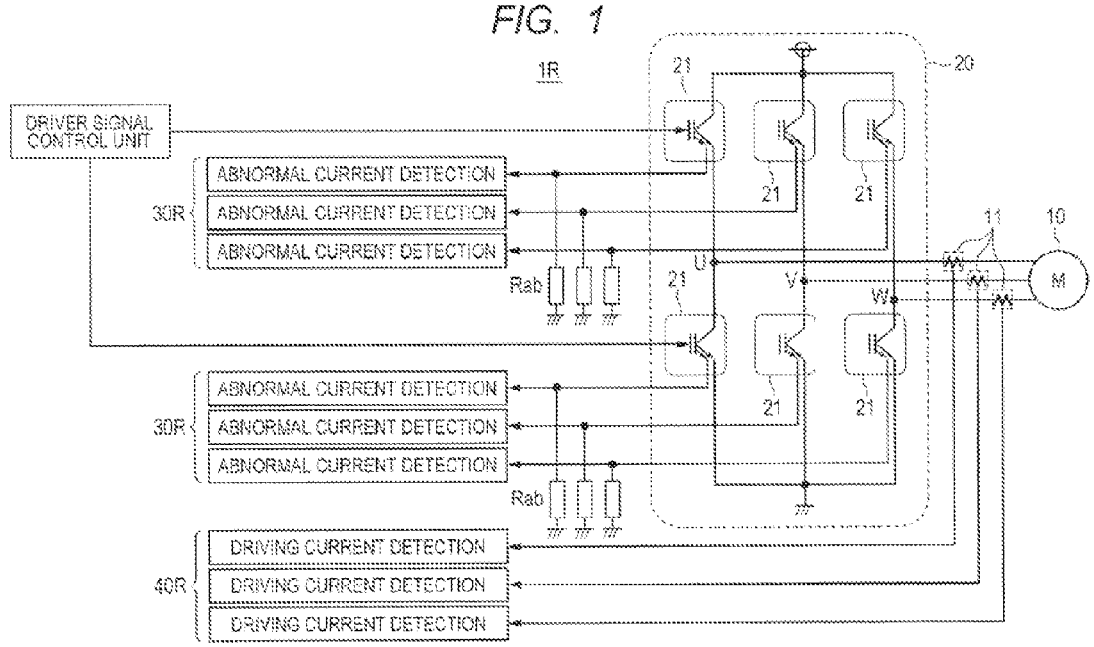
FIG. 1 is a block diagram for explaining an electric motor system according to a comparative example.

An embodiment, examples, and a modified example are described below, referring to the drawings. In the following description, the same components are labeled with the same reference signs and the redundant description may be omitted.

First, a technique studied by the inventors of the present invention prior to this disclosure (hereinafter, referred to as a comparative example) is described.

Figure 2:
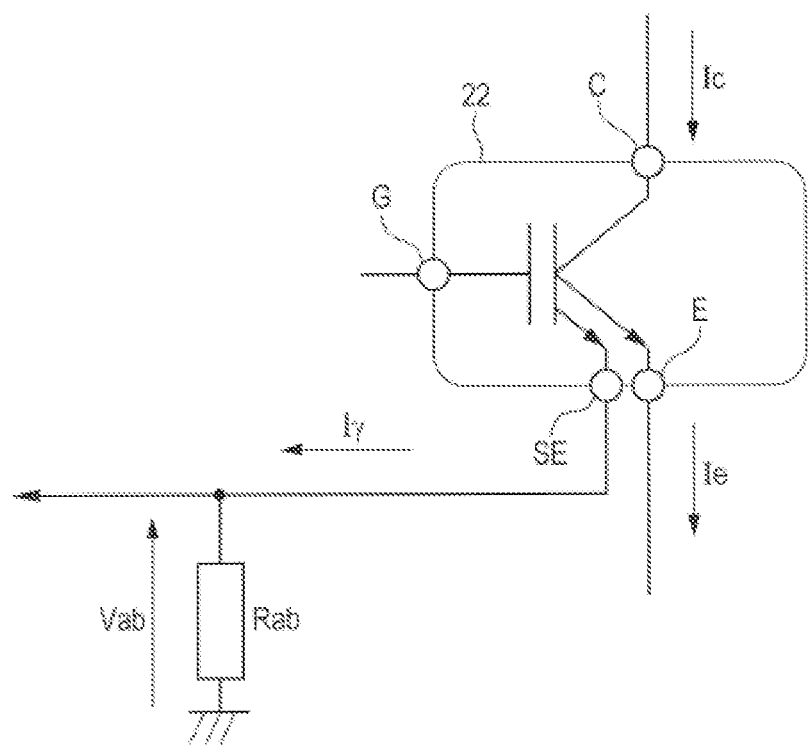
FIG. 2 is a diagram for explaining a sense current of an IGBT.

FIG. 1 is a block diagram showing a portion of an electric motor system according to the comparative example. FIG. 2 is a diagram for explaining a sense current of an IGBT. The electric motor system 1R includes a three-phase motor 10, an inverter circuit 20, a driver IC 30R, and a control circuit 40R. The three-phase motor 10 includes three transformers (coils) 11. The transformers may be two, because current calculation for each phase is possible as long as two phase currents can be detected. The inverter circuit 20 has a three-phase bridge configuration by six power semiconductor devices 21. As shown in FIG. 2, the power semiconductor device 21 includes an IGBT 22 that is a switching transistor. The IGBT 22 includes a gate terminal G, a collector terminal C, an emitter terminal E that allows a driving current to flow, and a current sensing terminal SE that allows a sense current to flow. The driver IC 30R drives the power semiconductor device 21, and the control circuit 40R controls the driver IC 30R.

For driving the motor, in the inverter circuit using the IGBT 22, it is necessary to control a driving signal (a PWM signal) that drives the IGBT 22, while monitoring the driving current. As the monitoring of the current, the following two are performed.

(1) A motor-driving current of each phase is monitored by means of the transformer 11 and an A/D converter of the control circuit 40R, for example, and is used for detection of a normal current in control of driving the motor.

(2) The sense current is monitored by means of a voltage comparison circuit and an A/D converter in the driver IC 30R for example, and is used mainly for detection of an overcurrent to cut off the driving signal when an abnormal current flows.

The driving current of the IGBT 22 is an emitter current (Ie), and the sense current is called a current mirror current (Iγ) because it is a current of a current mirror circuit in the IGBT 22. A ratio (Ie/Iγ) of the emitter current (Ie) and the current mirror current (Iγ) is called a current mirror ratio. The current mirror ratio is chosen to be about 1000 to about 10000. Assuming that a normal driving current of the motor is about 400 A, a rated current is about 1600 A. Therefore, in a case of using the sense current for determination of an abnormality exceeding the value of the rated current, a current detection voltage (Vab) in the detection of an abnormal current is as follows, assuming that the current mirror ratio is 4000 and a resistance (Rab) for current detection is 5 Ω.

$$Vab=(1600\ A/4000)\times 5\Omega=2\ V$$

Meanwhile, a current detection voltage (Vn) in a normal operation is as follows.

$$Vn=(400/4000)\times 5\Omega=0.5\ V$$

Further, in a low-speed range of the motor, a dynamic range is very small because the driving current is small.

At the start of rotation of the motor or in the low-speed range of the motor, it is desirable to increase not only the PWM signal that is the driving signal but also a current of the driving signal in order to improve a driving capability. However, in the current detection described in (1), an output voltage of the transformer is subjected to A/D conversion in the control circuit 40R and the driving control is adjusted based on the A/D conversion result, so that a loop time is required and therefore high-speed processing is difficult. Further, in a case of performing the control by the sense current as described in (2), because a loopback suitable for detection of the abnormal current is employed, it is difficult to obtain a sufficient gain.

<Embodiment>

Figure 14:
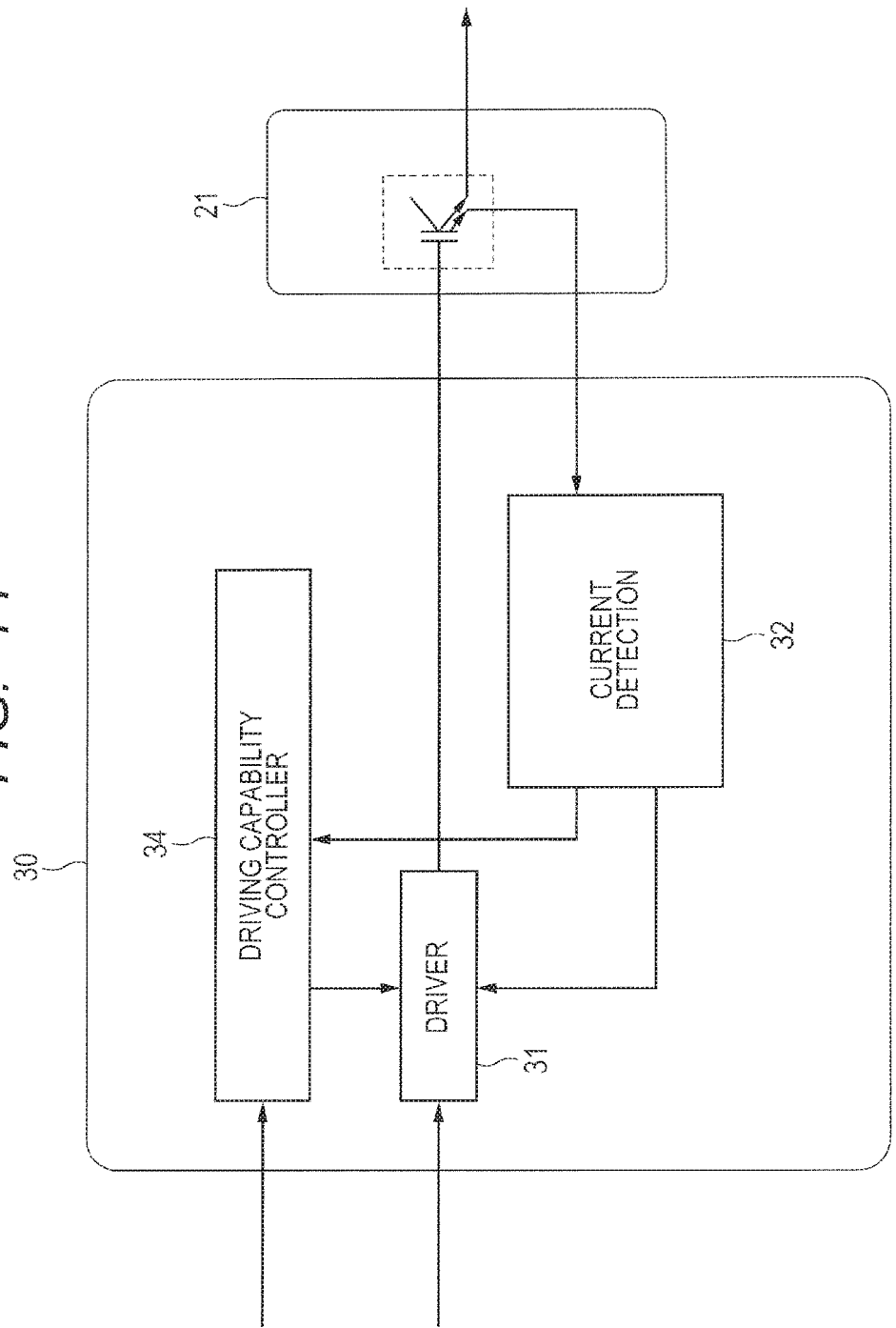
FIG. 14 is a block diagram for explaining a semiconductor integrated circuit device according to an embodiment.

FIG. 14 is a block diagram for explaining a semiconductor integrated circuit device according to an embodiment. The semiconductor integrated circuit device 30 includes a driving circuit 31 that drives the power semiconductor device 21, and a driving capability control circuit 34 that controls a driving capability of the driving circuit 31. The driving circuit 31 stops driving of the power semiconductor device 21 based on an abnormal current detected from a sense current of the power semiconductor device 21. The driving capability control circuit 34 controls the driving capability of the driving circuit 31 based on a normal current detected from the sense current of the power semiconductor device 21.

A driving capability of the power semiconductor device is improved, making it possible to drive a motor with a high torque, for example.

First Example (Electric Motor System)

Figure 3:
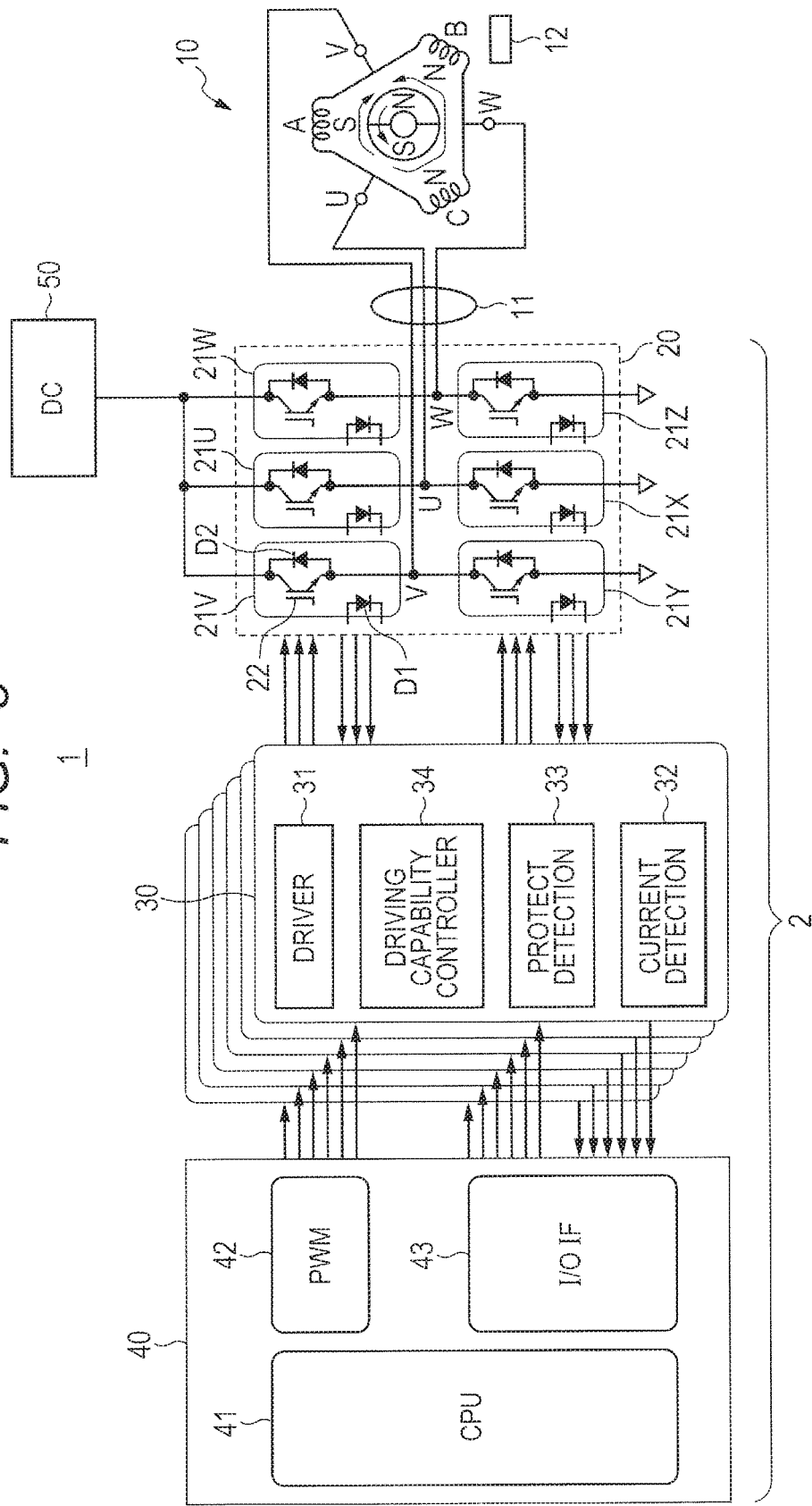
FIG. 3 is a block diagram for explaining an electric motor system according to a first example.

FIG. 3 is a block diagram showing a configuration of an electric motor system according to a first example. The electric motor system 1 of FIG. 3 includes the three-phase motor 10, the inverter circuit 20 using six power semiconductor devices, six driver ICs 30, a control circuit 40, and a DC power source 50. A portion formed by the inverter circuit 20, the six driver ICs 30, and the control circuit 40 is called an electronic device 2. When driving a vehicle or the like, the inverter circuit 20 controls on and off of the switching transistors 22 in the inverter circuit 20 to allow a current to flow to each phase of the three-phase motor 10 from a voltage of the DC power source (DC) 50, so that a speed of the vehicle or the like is changed by a frequency of this switching. When braking the vehicle or the like, the inverter circuit 20 controls on and off of the switching transistors 22 in synchronization with a voltage generated in each phase of the three-phase motor 10 to perform a so-called rectification operation that obtains a DC voltage, so that regeneration is performed.

The three-phase motor 10 includes a permanent magnet as a rotor and a coil as an armature. The armature windings of three phases (a U-phase, a V-phase, and a W-phase) are spaced at 120 degrees in delta connection. A current always flows through three coils of the U-, V-, and W-phases. The three-phase motor 10 includes a current detector 11, e.g. a transformer, and an angular-velocity and position detector 12.

The inverter circuit 20 forms bridge circuits of the U-, V-, and W-phases by power semiconductor devices. The U-phase bridge circuit is coupled to the three-phase motor 10 at a coupled point between a power semiconductor device 21U and a power semiconductor device 21X. The V-phase bridge circuit is coupled to the three-phase motor 10 at a coupled point between a power semiconductor device 21V and a power semiconductor device 21Y. The W-phase bridge circuit is coupled to the three-phase motor 10 at a coupled point between a power semiconductor device 21W and a power semiconductor device 21Z. Because the power semiconductor devices 21U, 21V, 21W, 21X, 21Y, and 21Z are the same in configuration, they may be collectively called power semiconductor devices 21. The power semiconductor device 21 is formed by a semiconductor chip including the switching transistor configured by an IGBT (hereinafter, simply referred to as the IGBT) 22 and a temperature-detecting diode D1 and a semiconductor chip including a flywheel diode D2 coupled between an emitter and a collector of the IGBT 22 in parallel. The flywheel diode D2 is coupled to allow a current to flow in an opposite direction to that of the current flowing through the IGBT 22. It is preferable that the semiconductor chip on which the IGBT 22 and the temperature-detecting diode D1 are formed and the semiconductor chip on which the flywheel diode D2 is formed are sealed in the same package. The flywheel diode D2 may be formed on the same chip as the IGBT 22 and the temperature-detecting diode D1.

The driver IC 30 that is a first semiconductor integrated circuit device includes, on one semiconductor substrate, the driving circuit (DRIVER) 31 that generates a signal driving a gate of the IGBT 22, a current detection circuit (CURRENT DETECTION) 32, a protection detection circuit (PROTECTION DETECTION) 33, and the driving capability control circuit (DRIVING CAPABILITY CONTROLLER) 34. The control circuit 40 that is a second semiconductor integrated circuit device includes a CPU 41, a PWM circuit (PWM) 42, and an I/O interface (I/O IF) 43 on one semiconductor substrate, and is formed by a microcomputer unit (MCU), for example. The CPU 41 operates in accordance with a program stored in a non-volatile memory that is electrically erasable and rewritable, such as a flash memory (not shown).

(Driver IC, Control Circuit)

Figure 4:
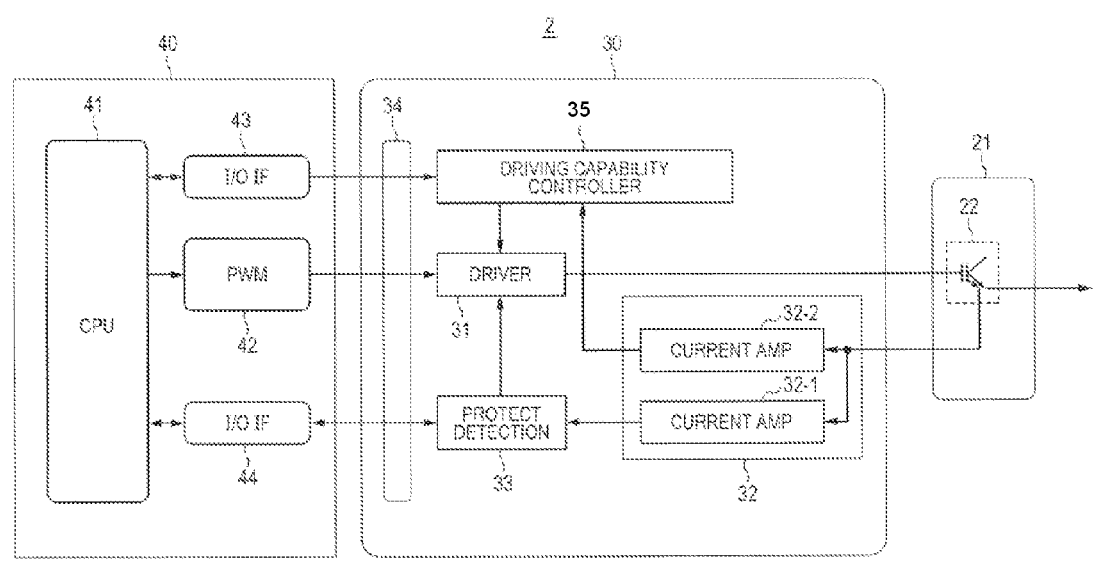
FIG. 4 is a block diagram showing an electronic device that is a portion of the electric motor system of FIG. 3.

FIG. 4 is a block diagram showing an electronic device that is a portion of the electric motor system of FIG. 3. The driver IC 30 includes the driving circuit 31, the current detection circuit 32, the protection detection circuit 33, an isolator 34, and the driving capability control circuit 35. The current detection circuit 32 includes a current amplification circuit (CURRENT AMP) 32-1 that detects an abnormal current and a current amplification circuit 32-2 that detects a normal current. The current amplification circuit (CURRENT AMP) 32-1 converts a sense current to a voltage (V1), and the protection detection circuit 33 detects the abnormal current based on that voltage. The detection result is sent to the driving circuit 31, so that a driving signal of the IGBT 22 is cut off Also, the detection result is sent to the CPU 41 via the isolator 34 and the I/0 interface 44 of the control circuit 40. The current amplification circuit 32-2 converts the normal current to a voltage (V2). The voltage is sent to the driving capability control circuit 35, so that the driving capability control circuit 35 controls a driving capability of the driving circuit 31. The isolator 34 transmits a signal to be transmitted between the driver IC 30 and the control circuit 40, via magnetic coupling. The isolator 34 is formed by insulating an on-chip transformer formed by wirings with an interlayer film.

Figure 5:
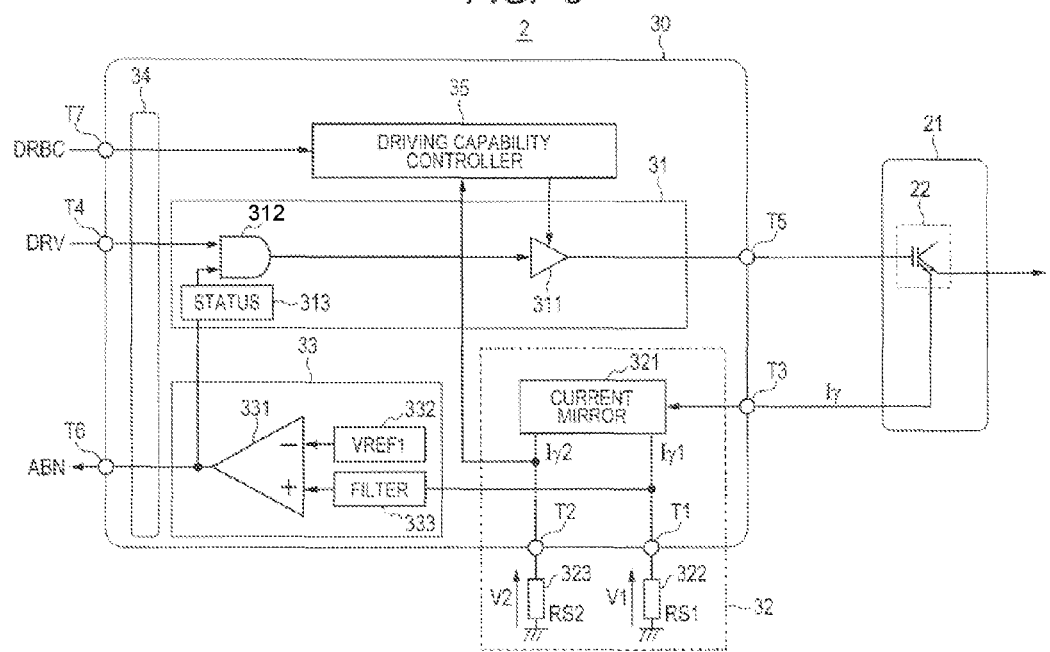
FIG. 5 is a block diagram for explaining a driver IC in FIG. 4.

FIG. 5 is a block diagram showing the driver IC in FIG. 4. The current detection circuit 32 is formed by a current mirror circuit (CURRENT MIRROR) 321, and resistors 322 and 323 respectively coupled to terminals T1 and T2. The current mirror circuit 321 divides a current (Iγ) flowing thereto from a current sensing terminal NE of the IGBT 22 via a terminal T3 into an abnormal current (Iγ1) and a normal current (Iγ2). Current mirror ratios and detection resistances, which are appropriate for detection of the abnormal current and detection of the normal current, are set. Assuming that a resistance value of the resistor 322 for detecting the abnormal current is RS1, a resistance value of the resistor 323 for detecting the normal current is RS2, the voltage for detecting the abnormal current is V1, and the voltage for detecting the normal current is V2, $$V1 = I\gamma 1 \times RS1$$

$$V2 = I\gamma 2 \times RS2$$

The protection detection circuit 33 includes a comparator 331, a reference voltage generation circuit 332, and a filter 333. The comparator 331 compares the abnormal-current detection voltage (V1) input to its non-inverting input terminal via the filter (FILTER) 333 and a reference voltage (VREF1) of the reference voltage generation circuit 332 input to its inverting input terminal with each other and, when V1 is larger than VREF1, detects the abnormal current and outputs an abnormal-current signal (ABN).

The driving circuit 31 includes a driver 311, an AND gate 312, and a status retaining circuit 313. The status retaining circuit 313 retains the abnormal-current signal (ABN) detected by the protection detection circuit 33. In a case where the abnormal-current signal (ABN) indicates occurrence of an abnormality, the status retaining circuit 313 sets an output of the AND gate 312 to be LOW to cut off a drive signal (DRV) input from a terminal T4. In a case where the abnormal-current signal (ABN) indicates that no abnormality occurs, the status retaining circuit 313 allows the AND gate 312 to pass the drive signal (DRV) therethrough. The driver 311 sends the drive signal (DRV) to the gate terminal G of the IGBT 22 via a terminal T5 based on voltage control or current control by the driving capability control circuit 35. The abnormal-current signal (ABN) is sent to the control circuit 40 via a terminal T6.

Figure 6:
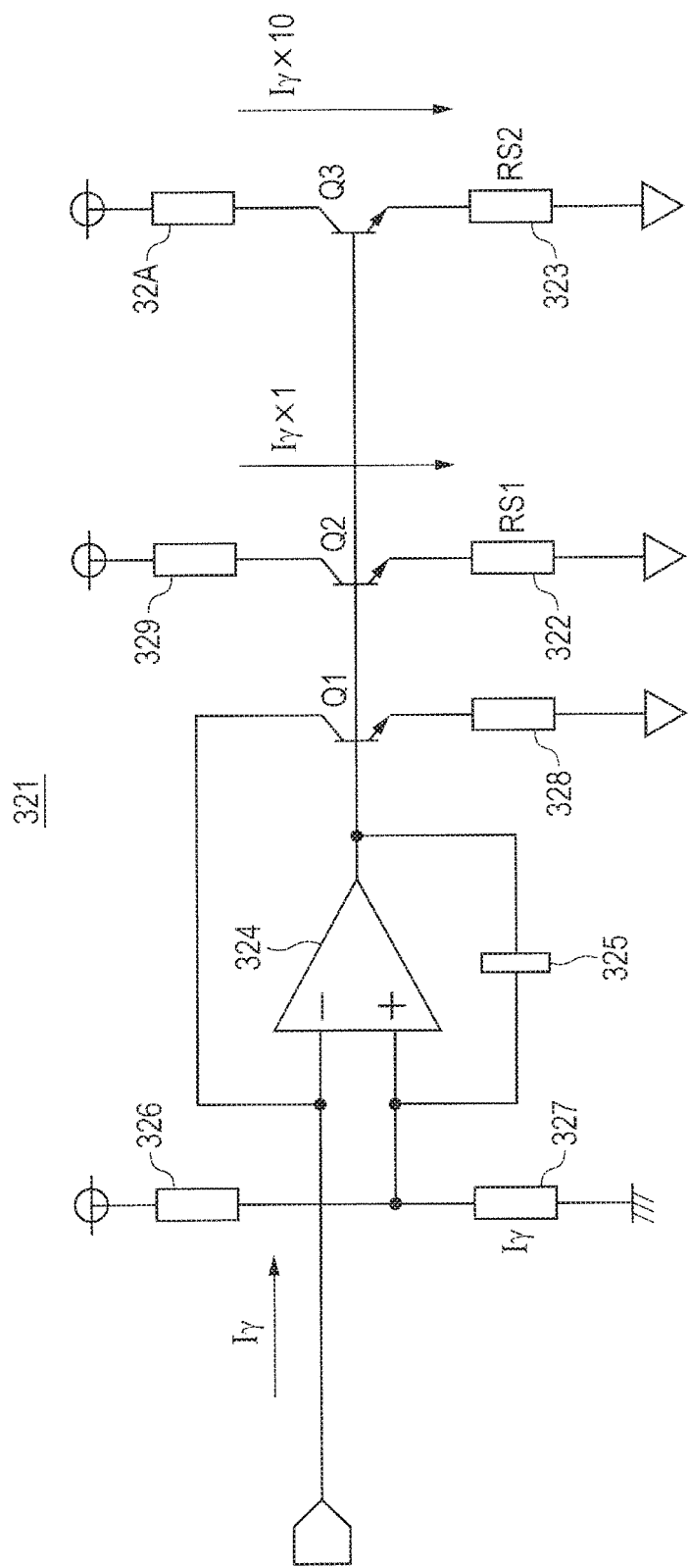
FIG. 6 is a circuit diagram for explaining a current mirror circuit in FIG. 5.

FIG. 6 is a circuit diagram of the current mirror circuit in FIG. 5. The current mirror circuit 321 includes an operational amplifier 324, a filter capacitor 325, transistors Q1, Q2, and Q3, and resistors 322, 323, 326, 327, 328, 329, and 32A. When a receiving buffer circuit is configured by the input operational amplifier 324 to which the current mirror current (Iγ) of the IGBT 22 flows and the transistor Q1, the same voltage as a base voltage of the transistor Q1 is input to the other transistors Q2 and Q3, and current amplification in the transistors Q2 and Q3 is designed to obtain expected values, respectively. the current of the transistor Q2 can be set to Iγ×1 and the the current of the transistor Q3 can be set to Iγ×10, for example.

Figure 7:
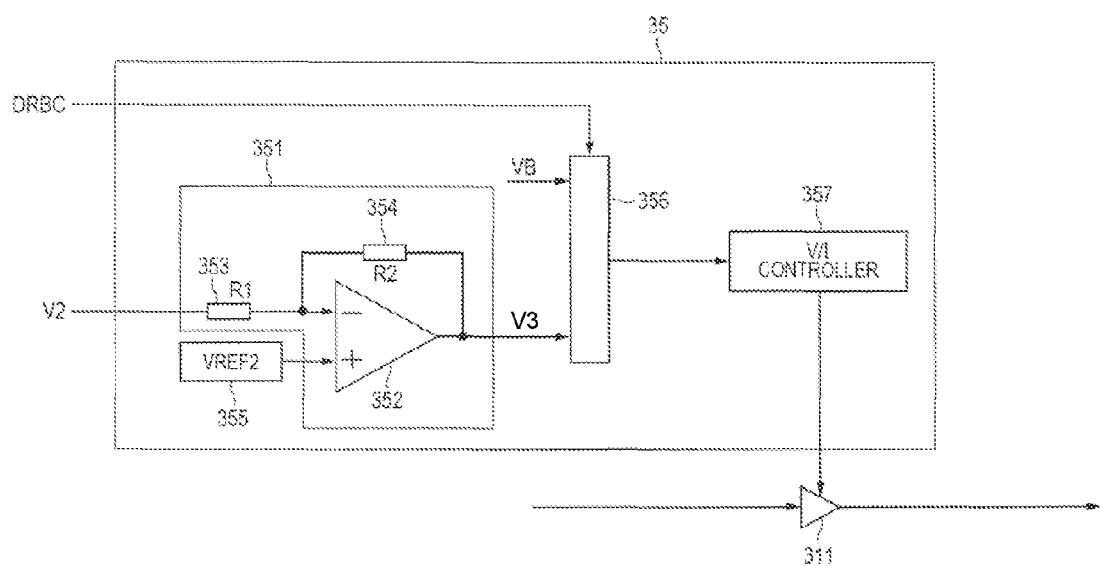
FIG. 7 is a block diagram for explaining a configuration of a driving capability control circuit in FIG. 5.

FIG. 7 is a block diagram of the driving capability control circuit in FIG. 5. The driving capability control circuit 35 includes an amplification circuit 351, a reference voltage generation circuit 355, a switching circuit 356, and a voltage or current control circuit (V/I CONTROLLER) 357. The amplification circuit 351 is an inverting differential amplification circuit formed by an operational amplifier 352 and resistors 353 and 354, and performs amplification to a voltage (V3) that is obtained by multiplying a difference between a reference voltage (VREF2) of the reference voltage generation circuit 355 and the normal-current detection voltage (V2) by a ratio of a resistance value (R2) of the resistor 353 and a resistance value (R1) of the resistor 354.

$$V3 = (VREF2 - V2) \times R2/R1$$

When V2 is small, V3 is large. When V2 is large, V3 is small.

The switching circuit 356 performs switching between a basic setting voltage (VB) and the voltage (V3) based on a driving-capability control signal (DRBC) input via a terminal T7 from the control circuit 40, to supply the voltage to the voltage or current control circuit 357.

The voltage or current control circuit 357 controls a voltage or a current of the driver 311 to control an output voltage or an output current of the driver 311. The voltage (V3) is higher than the basic setting voltage (VB), and when the basic setting voltage (VB) is switched to the voltage (V3), the output voltage or the output current of the driver 311 increases.

Figure 8:
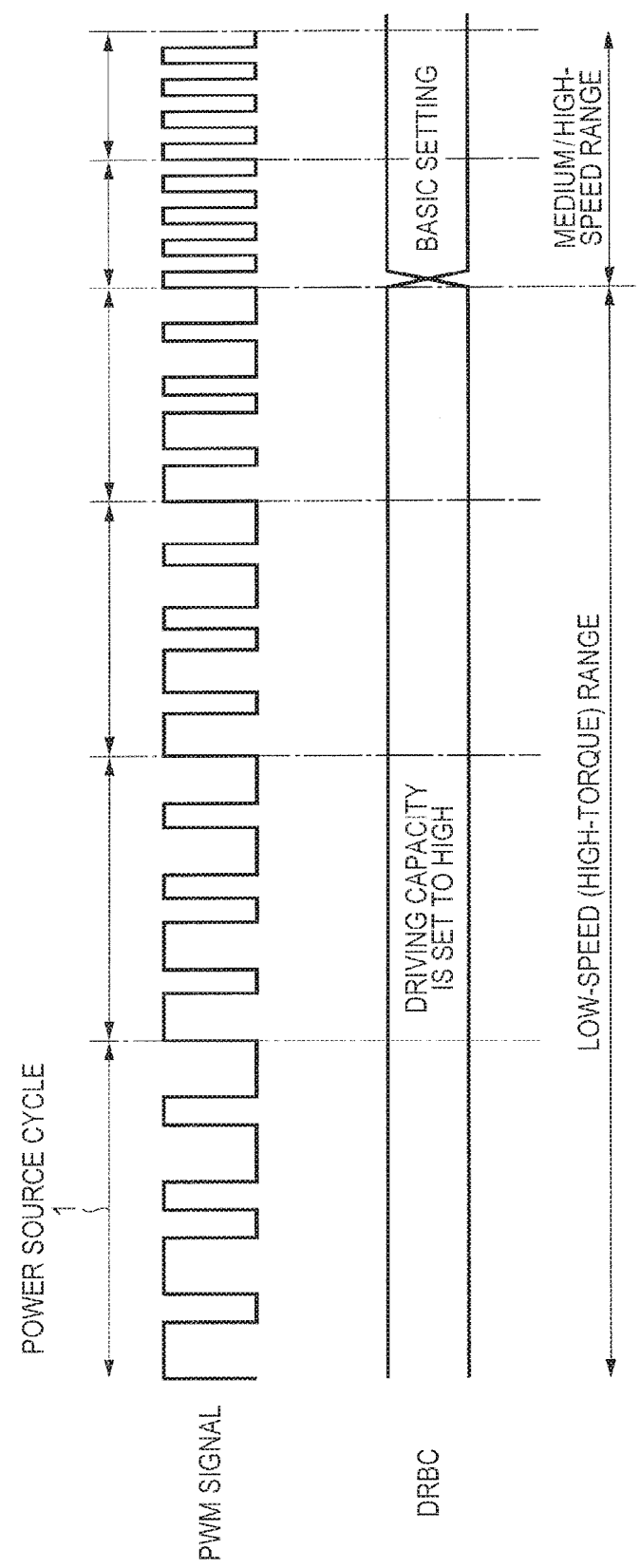
FIG. 8 is a timing chart for explaining control of the driving capability control circuit in FIG. 5.

FIG. 8 is a timing chart for explaining control by the driving capability control circuit in FIG. 5. In a low-speed (high-torque) range of a motor, 1 power source cycle is set to be longer and a duty of a PWM signal is set to be larger than in a medium/high-speed range. Also, in the low-speed range, switching to the voltage (V3) is caused by the driving-capability control signal (DRBC) input from the terminal T7, in order to set a driving capability of the driver 311 to be higher. In the medium/high-speed range, switching to the basic setting voltage (VB) is caused by the driving-capability control signal (DRBC).

According to this example, in order to improve the driving capability, not only the PWM signal that is the drive signal but also the current of the drive signal can be increased at the start of rotation of the motor or during rotation at low speeds. Further, current detection is performed by using the sense current, but does not use a transformer. Therefore, no loop time is required in which an output voltage of the transformer is subjected to A/D conversion in the control circuit 40 and drive control is adjusted based on the result of A/D conversion. Thus, it is easy to achieve high-speed processing. Furthermore, there are employed both a loop back suitable for detection of the abnormal current and a loop back suitable for detection of the normal current. Therefore, a sufficient gain can be obtained.

Second Example

Figure 9:
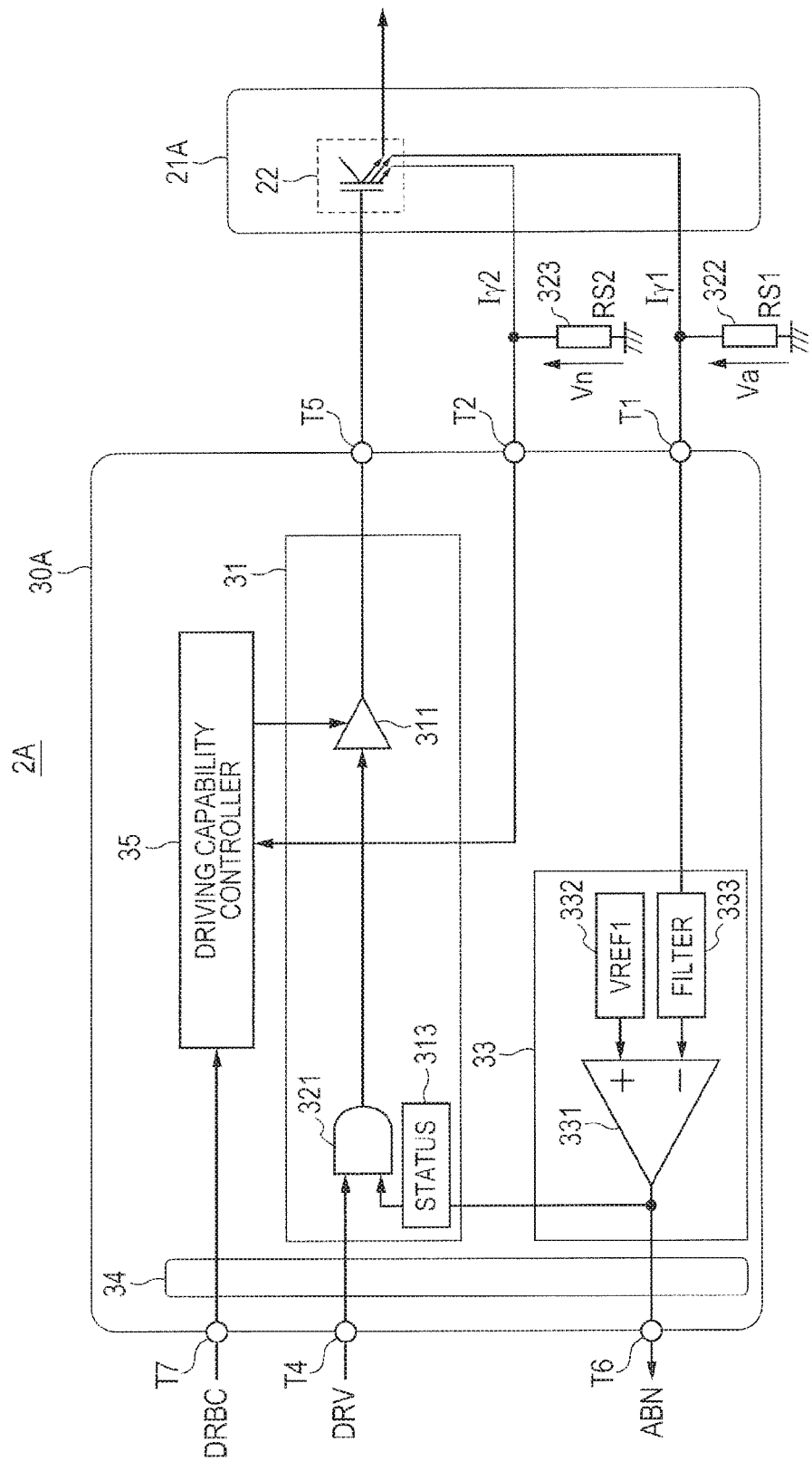
FIG. 9 is a block diagram for explaining an IGBT and a driver IC according to a second example.

FIG. 9 is a block diagram of an electronic device according to a second example. The electronic device according to the second example includes two current mirrors in one IGBT, but omits the current mirror circuit in the driver IC according to the first example. The other configuration is the same as that in the first example.

The IGBT 22 in the first example is formed by several thousands to several tens of thousands of cells having the same configuration. A portion of the cells is used as cells for detecting the sense current (the abnormal current), a region formed by the cells for detecting the sense current is referred to as an "abnormal-current detection region", and a region formed by the other cells are referred to as a "main region". A ratio (Nm/Ns) of the number of the cells in the main region (Nm: an integer) and the number of the cells in the abnormal-current detection region (Ns: an integer) is set to be several thousands. An IGBT 22A in the second example further includes cells for detecting the sense current (the normal current), and a region formed by those cells is referred to as a normal-current detection region. Assuming that the number of the cells in the normal-current detection region is Nns (an integer) , Nns/Ns is set to be 10, for example.

Figure 10:
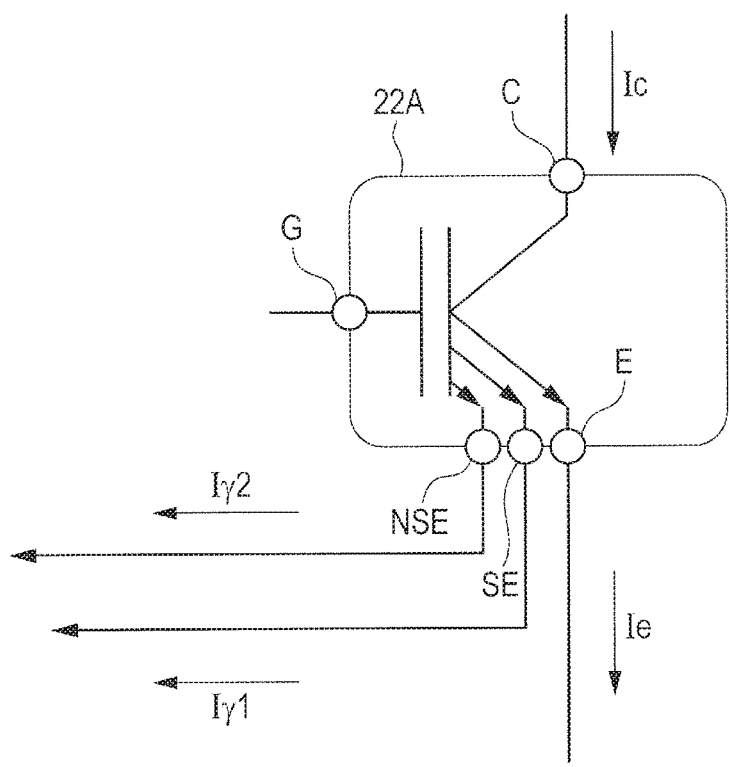
FIG. 10 is a diagram for explaining the IGBT in FIG. 9.

As shown in FIG. 10, a collector terminal in the IGBT 22A is common to the main region, the abnormal-current detection region, and the normal-current detection region, whereas an emitter terminal is separated into a main emitter terminal E (hereinafter, referred to as a main terminal), an emitter terminal SE for abnormal current detection (hereinafter, referred to as a sense terminal), and an emitter terminal NSE for normal current detection (hereinafter, referred to as a normal sense terminal). A gate terminal G for driving each region is common.

A current mirror current (Iγ1) from the sense terminal SE generates an abnormal-current detection voltage (V1) by the resistor 322 for detecting the abnormal current coupled to the terminal T1. The current mirror circuit of the IGBT 22A and the resistor 322 for detecting the abnormal current form an abnormal-current detection circuit. A current mirror current (Iγ2) from the normal sense terminal NSE generates a normal-current detection voltage (V2) by the resistor 323 for detecting the normal current coupled to the terminal T2. The current mirror circuit of the IGBT 22A and the resistor 323 for detecting the normal current form a normal-current detection circuit.

Because no current mirror circuit is required in the driver IC according to this example, the driver IC can have a simpler configuration than in the first example, thus reducing a chip area.

Third Example

Figure 11:
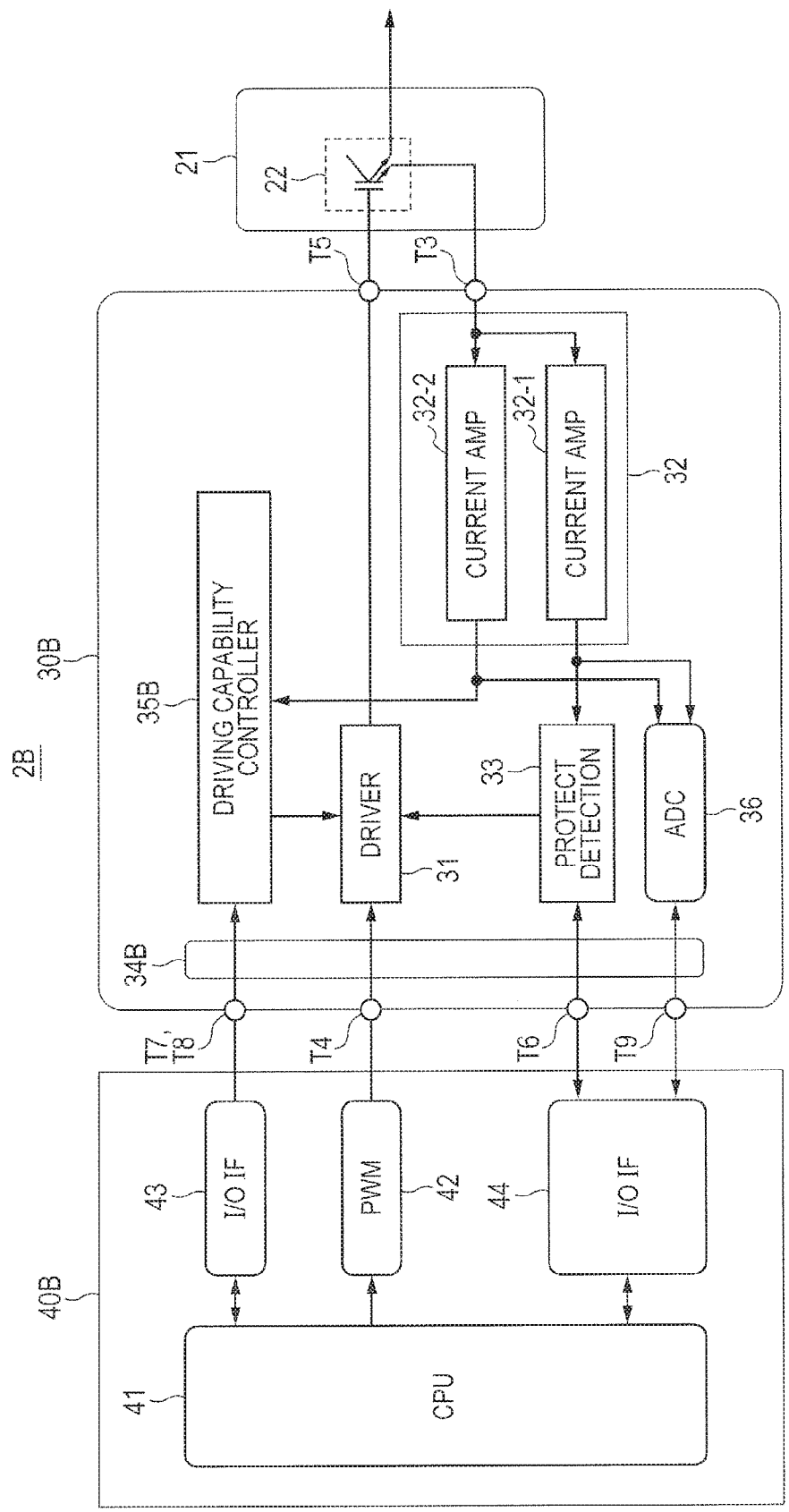
FIG. 11 is a block diagram for explaining a driver IC and a control circuit according to a third example.

FIG. 11 is a block diagram of an electronic device according to a third example. The electronic device according to the third example further includes an A/D converter in the driver IC of the first example and can perform feed-back to the driving capability control circuit. The other configuration is the same as that in the first example.

A driver IC 30B includes the A/C converter (ADC) 36 for informing a control circuit 40B of the abnormal-current detection voltage (Va) and the normal-current detection voltage (Vn) that are the outputs of the current detection circuit 32 (the current amplification circuits 32-1 and 32-2). An output of the A/D converter 36 is sent to the control circuit 40B via an isolator 34B and a terminal T9.

Figure 12:
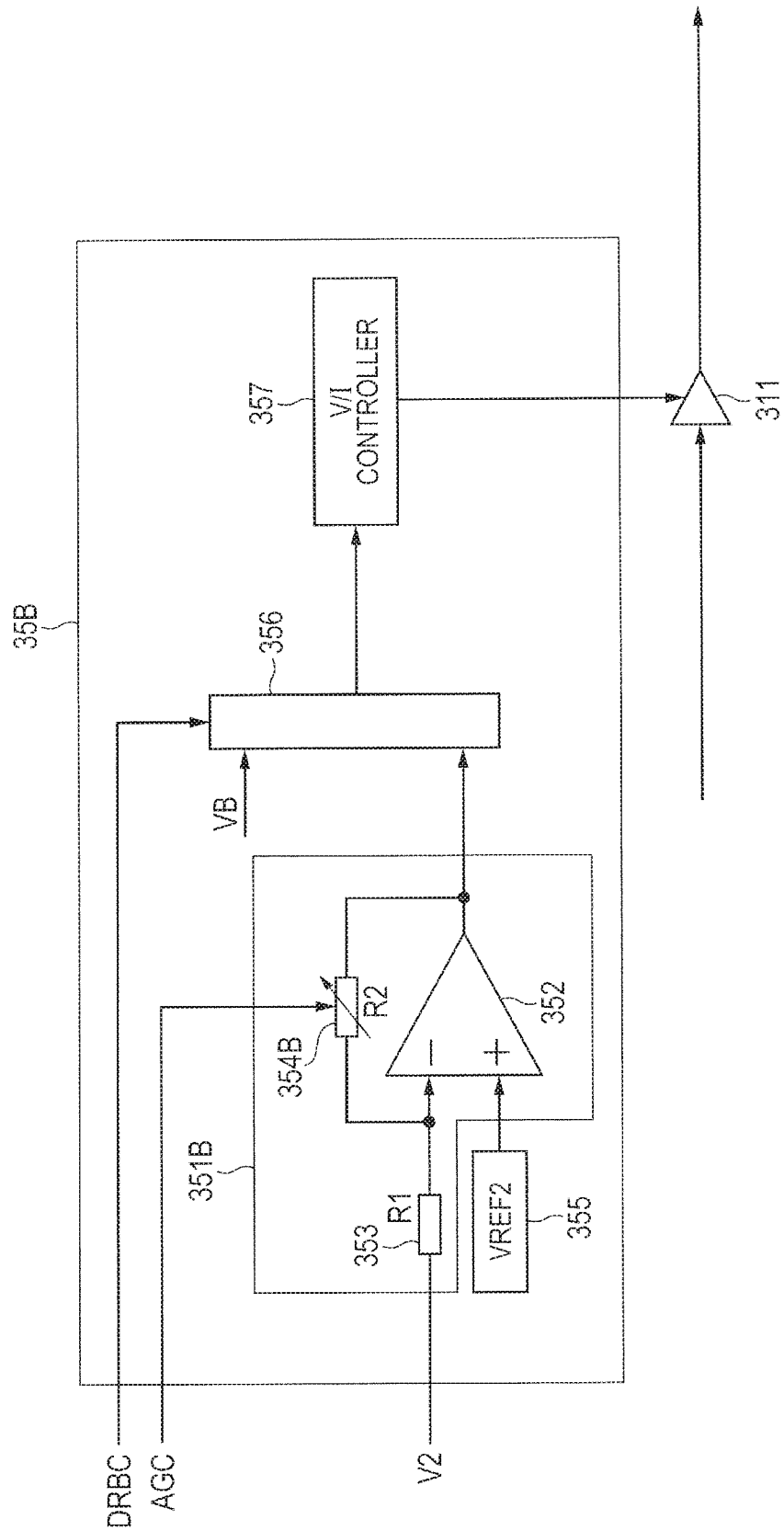
FIG. 12 is a block diagram for explaining the driving capability control circuit in FIG. 11.

FIG. 12 is a block diagram for explaining a driving capability control circuit in FIG. 11. The driving capability control circuit in the third example has a function of allowing a resistance value of a loop resistor in an amplification circuit to be adjusted, and the other configuration is the same as that in the first example. The control circuit 40B generates a control signal (AGC) based on the voltage (Vn) obtained through the A/D converter 36. A resistor 354B of the amplification circuit 351B of the driving capability control circuit 35B is a variable resistor having a resistance value adjustable based on the control signal (AGC) input from a terminal T8. Because a function of allowing a feed-back gain of the normal-current detection voltage (Vn) to be adjusted (the function of allowing the loop resistor 354B of the amplification circuit 351B to be adjusted) is provided, it is possible to control the driving capability with a high accuracy by adjusting that gain in accordance with a variation of the resistance value (RS2) of the resistor 323 for detecting the normal current.

<Modified Example>

Figure 13:
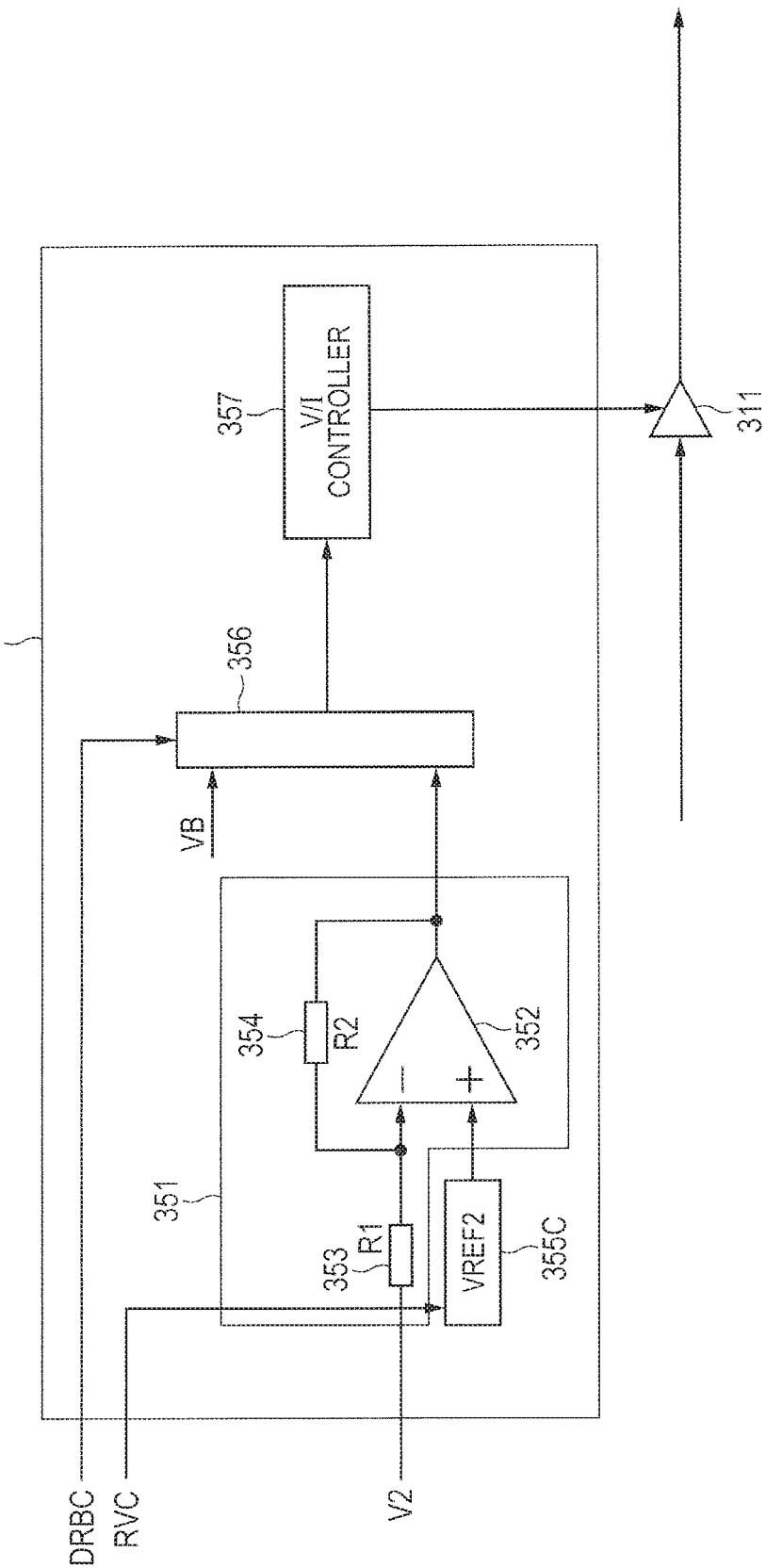
FIG. 13 is a block diagram for explaining the driving capability control circuit in FIG. 11.

FIG. 13 is a block diagram for explaining the driving capability control circuit in FIG. 11. The driving capability control circuit of this example has a function of allowing the reference voltage (VREF2) of the first example to be adjusted, and the other configuration is the same as that in the first example. The control circuit 40B generates a control signal (RVC) based on the voltage (Vn) obtained through the A/D converter 36. The reference voltage (VREF2) of a reference voltage generation circuit 355C of the driving capability control circuit 35C is variable, and can be adjusted based on the control signal (RVC) input from the terminal T8. Because the function of allowing the feed-back gain of the normal-current detection voltage (Vn) to be adjusted (the function of allowing the reference voltage (VREF2) of the reference voltage generation circuit 355C to be adjusted) is provided, it is possible to control the driving capability with a high accuracy by adjusting that gain in accordance with the variation of the resistance value (RS2) of the resistor 323 for detecting the normal current.

The invention made by the inventors has been specifically described above, based on the embodiment, the examples, and the modified example. However, it should be noted that the present invention is not limited thereto, but can be changed in various ways.

What is claimed is:

1. A semiconductor integrated circuit device comprising:
   a driving circuit configured to drive a power semiconductor device;
   a driving capability control circuit configured to control a driving capability of the driving circuit; and
   a current detection circuit configured to receive a sense current of the power semiconductor device and output a first control signal to the driving circuit and a second control signal, separate from the first control signal, to the driving capability control circuit,
   wherein the driving circuit is further configured to receive the first control signal and stop the driving of the power semiconductor device based on the first control signal, and
   wherein the driving capability control circuit is further configured to receive the second control signal and control the driving capability of the driving circuit based on the second control signal.

2. The semiconductor integrated circuit device according to claim 1, wherein the current detection circuit comprises:
   a first current detection circuit configured to receive the sense current and output an abnormal-current detection voltage as the first control signal based on the sense current of the power semiconductor device, and
   a second current detection circuit configured to receive the sense current and output a normal-current detection voltage as the second control signal based on the sense current of the power semiconductor device.

3. The semiconductor integrated circuit device according to claim 2, wherein the driving capability control circuit comprises:
   a circuit generating a voltage based on the normal-current detection voltage, and
   a control circuit controlling, based on the generated voltage, a voltage or a current of the driving circuit.

4. The semiconductor integrated circuit device according to claim 3, wherein the circuit includes an amplification circuit having an operational amplifier and a loop resistor, and a circuit generating a reference voltage, and
wherein a resistance value of the loop resistor or the reference voltage is changeable based on a third control signal.

5. The semiconductor integrated circuit device according to claim 4, further comprising:
an A/D conversion circuit that converts the normal-current detection voltage,
a terminal that outputs an output of the A/D conversion circuit, and
a terminal to which the third control signal generated based on the output of the A/D conversion circuit is input.

6. The semiconductor integrated circuit device according to claim 1, further comprising
a first terminal to be coupled to a terminal that outputs the sense current from which an abnormal current of the power semiconductor device is detected, and
a second terminal to be coupled to a terminal that outputs the sense current from which a normal current is detected.

7. The semiconductor integrated circuit device according to claim 6,
wherein a resistor for detecting the abnormal current of the power semiconductor device is coupled to an outside so that the first terminal is configured to receive an abnormal-current detection voltage, and
wherein a resistor for detecting the normal current of the power semiconductor device is coupled to the outside so that the second terminal is configured to receive a normal-current detection voltage.

8. The semiconductor integrated circuit device according to claim 7,
wherein the driving capability control circuit includes
a circuit generating a voltage based on the normal-current detection voltage, and
a control circuit controlling, based on the generated voltage, a voltage or a current of the driving circuit.

9. The semiconductor integrated circuit device according to claim 1, wherein the current detection circuit simultaneously outputs the first control signal and the second control signal.

10. The semiconductor integrated circuit device according to claim 1, wherein the driving capability control circuit is further configured to vary the driving capability of the driving circuit based on the second control signal, while the driving circuit drives the power semiconductor device based on the first control signal.

11. A semiconductor integrated circuit device comprising:
a driving circuit that drives a power semiconductor device; and
a driving capability control circuit that controls a driving capability of the driving circuit, wherein the driving circuit stops driving of the power semiconductor device based on an abnormal current detected from a sense current of the power semiconductor device, and wherein the driving capability control circuit controls the driving capability of the driving circuit based on a normal current detected from the sense current of the power semiconductor device;
a first current detection circuit that outputs an abnormal-current detection voltage based on the sense current of the power semiconductor device; and
a second current detection circuit that outputs a normal-current detection voltage based on the sense current of the power semiconductor device,
wherein the first current detection circuit and the second current detection circuit are respectively formed by a current mirror circuit, and
wherein a first resistor is coupled to a first terminal of the current mirror circuit for detecting the abnormal current of the power semiconductor device to an outside and a second resistor is coupled to a second terminal of the current mirror circuit for detecting the normal current of the power semiconductor device to the outside are provided.

12. An electronic device comprising:
a power semiconductor device;
a first semiconductor integrated circuit device; and
a second semiconductor integrated circuit device,
wherein the first semiconductor integrated circuit device comprises:
a driving circuit configured to drive the power semiconductor device;
a driving capability control circuit configured to control a driving capability of the driving circuit; and
a current detection circuit configured to receive a sense current of the power semiconductor device and output a first control signal to the driving circuit and a second control signal, separate from the first control signal, to the driving capability control circuit,
wherein the driving circuit is further configured to receive the first control signal and stop the driving of the power semiconductor device based on the first control signal, and
wherein the driving capability control circuit is further configured to receive the second control signal and control the driving capability of the driving circuit based on the second control signal.

13. The electronic device according to claim 12,
wherein the power semiconductor device comprises:
a first terminal that supplies a current for driving a load, and
a second terminal that supplies a current for monitoring a driving current, and
wherein the current detection circuit of the first semiconductor integrated circuit device comprises:
a first current detection circuit configured to receive the sense current and output an abnormal-current detection voltage as the first control signal based on the current from the second terminal, and
a second current detection circuit configured to receive the sense current and output a normal-current detection voltage as the second control signal based on the current from the second terminal.

14. The electronic device according to claim 13,
wherein the first semiconductor integrated circuit device comprises:
a fourth terminal coupling a first resistor for detecting an abnormal current of the power semiconductor device to an outside, and
a fifth terminal coupling a second resistor for detecting a normal current of the power semiconductor device to the outside,
wherein the first current detection circuit and the second current detection circuit are respectively formed by a current mirror circuit.

15. The electronic device according to claim 13,
wherein the driving capability control circuit of the first semiconductor integrated circuit device comprises:
a circuit generating a voltage based on the normal-current detection voltage, and a control circuit controlling, based on the generated voltage, a voltage or a current of the driving circuit.

16. The electronic device according to claim 15,
wherein the circuit includes an amplification circuit having an operational amplifier and a loop resistor, and a circuit generating a reference voltage, and
wherein a resistance value of the loop resistor or the reference voltage is changeable based on a third control signal.

17. The electronic device according to claim 16,
wherein the first semiconductor integrated circuit device further includes an A/D conversion circuit converting the normal-current detection voltage, and
wherein the second semiconductor integrated circuit device includes a CPU generating the third control signal based on an output of the A/D conversion circuit.

18. The electronic device according to claim 13,
wherein the power semiconductor device includes
a first terminal that supplies a current for driving a load,
a second terminal that supplies a current for monitoring a driving current, and
a third terminal that supplies a current for monitoring the driving current, and wherein the first semiconductor integrated circuit device includes
a fourth terminal to be coupled to the second terminal, and
a fifth terminal to be coupled to the third terminal.

19. The electronic device according to claim 18, further comprising:
a resistor for detecting an abnormal current of the power semiconductor device, coupled to the third terminal, and
a resistor for detecting a normal current of the power semiconductor device, coupled to the fourth terminal,
wherein the third terminal is configured to receive the abnormal-current detection voltage and
wherein the fourth terminal is configured to receive the normal-current detection voltage.

20. The electronic device according to claim 19,
wherein the driving capability control circuit includes
a circuit generating a voltage based on the normal-current detection voltage, and
a control circuit controlling, based on the generated voltage, a voltage or a current of the driving circuit.

\* \* \* \* \*